United States Patent
Maas et al.

(10) Patent No.: US 6,452,272 B1
(45) Date of Patent: Sep. 17, 2002

(54) SEMICONDUCTOR DEVICE

(75) Inventors: Henricus Godefridus Rafael Maas; Maria Henrica Wilhelmina Antonia Van Deurzen, both of Eindhoven (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/763,841

(22) PCT Filed: Jun. 26, 2000

(86) PCT No.: PCT/EP00/05915

§ 371 (c)(1),
(2), (4) Date: Feb. 27, 2001

(87) PCT Pub. No.: WO01/01485

PCT Pub. Date: Jan. 4, 2001

(30) Foreign Application Priority Data

Jun. 29, 1999 (EP) .............................................. 99202104

(51) Int. Cl.[7] .............................................. H01L 23/48
(52) U.S. Cl. ........................ 257/750; 257/378; 257/379; 257/368
(58) Field of Search ................................ 257/306, 664, 257/750, 758, 760, 777, 368, 378, 379; 438/3, 643, 788, 790, 456, 240, 692, 634, 652, 199

(56) References Cited

U.S. PATENT DOCUMENTS

| | | | |
|---|---|---|---|
| 4,485,553 A | 12/1984 | Christian et al. .............. 29/589 |
| 5,646,432 A | 7/1997 | Iwaki et al. ................. 257/347 |
| 5,654,222 A | * 8/1997 | Sandhu et al. .................. 438/3 |
| 5,872,393 A | * 2/1999 | Sakai et al. .................. 257/664 |
| 5,913,144 A | * 6/1999 | Nguyen et al. ............. 438/643 |
| 5,955,758 A | * 9/1999 | Sandhu et al. .............. 257/306 |

* cited by examiner

*Primary Examiner*—Hoai Ho
*Assistant Examiner*—Long Tran
(74) *Attorney, Agent, or Firm*—Steven R. Biren (57) ABSTRACT

A semiconductor device 1 comprises a body 2 of insulating material having a surface 3 to which a semiconductor element 4 and an interconnect structure 5 are fastened, which interconnect structure 5 is disposed between the semiconductor element 4 and the body 2 of insulating material and has a patterned metal layer 7 facing the body 2 of insulating material, which patterned metal layer 7 comprises conductor tracks 8 and 9.

In order to reduce the power consumption of the semiconductor device 1, an insulating layer 12 having a dielectric constant $\in_r$ below 3 is disposed between the patterned metal layer 7 of the interconnect structure 5 and the body 2 of insulating material, and an insulating barrier layer 13 is disposed between the semiconductor element 4 and the insulating layer 12 having a dielectric constant $\in_r$ below 3, so as to counteract that contaminants from the insulating layer 12 having a dielectric constant $\in_r$ below 3 can reach the semiconductor element 4.

19 Claims, 6 Drawing Sheets

SEMICONDUCTOR DEVICE

The invention relates to a semiconductor device comprising a body of insulating material, which body of insulating material has a surface to which a semiconductor element and an interconnect structure are fastened, which interconnect structure is disposed between the semiconductor element and the body of insulating material and has a superficial patterned metal layer facing the body of insulating material, which superficial patterned metal layer comprises conductor tracks.

Such a semiconductor device is particularly suited for processing signals of very high frequencies. The semiconductor element may be a single diode or a single transistor, but it may alternatively be an integrated circuit comprising a large number of transistors. The interconnect structure may serve for the electrical connection of the semiconductor element to other semiconductor elements and may be provided with contact portions (bonding pads) to enable electrical contact of the semiconductor device to the external world, but may also comprise passive elements such as inductors, capacitors and resistors.

In practice, the semiconductor device can be mounted on a customary printed circuit board (PCB) or accommodated in a customary envelope. The mounting surface of the printed circuit board as well as the inside of the envelope are provided with an interconnect structure comprising conductor tracks for electrically contacting the semiconductor device. The body of insulating material is hence sandwiched between the interconnect structure of the semiconductor device and the interconnect structure present on the printed circuit board or inside the envelope, so that parasitic capacitances between these interconnect structures are small. As a result, parasitic currents flowing during the processing of high-frequency signals are small. By virtue thereof, the power consumption of the semiconductor device is small, which is particularly advantageous for application in mobile telephony, where signals with a frequency in the order of 1 GHz must be processed and the power must be supplied by batteries. The power consumption of a semiconductor device mentioned above may be a factor of 20 smaller than that of a customary semiconductor device, which is formed on an ordinary, relatively thick body of semiconductor material.

A semiconductor device of the kind mentioned in the opening paragraph is known from U.S. Pat. No. 5,646,432, in which the interconnect structure of the semiconductor device is covered by an insulating layer of silicon oxide or silicon nitride in a thickness of preferably 2 $\mu$m, and a planarizing layer of preferably less than 2 $\mu$m is provided between this insulating layer and a layer of an adhesive having a thickness in the range between 10 and 20 $\mu$m.

Although parasitic capacitances between the interconnect structure of the semiconductor device and the interconnect structure present on a printed circuit board or inside an envelope are already small, it is desirable to minimize them as far as possible in connection with the power consumption of the semiconductor device. If, for example, a body of glass having a dielectric constant $\in_r$ of approximately 6.5 and a thickness of 400 $\mu$m is used as the body of insulating material, then the parasitic capacitance between a 1 $\mu$m wide conductor track of the interconnect structure of the semiconductor device and the interconnect structure present on the printed circuit board or inside the envelope amounts to approximately $26.10^{-18}$ F per $\mu$m of length of the conductor track. The use of a thicker body of glass is impractical, as a doubling in thickness to 800 $\mu$m only results in a reduction of the parasitic capacitance by approximately 10%. Moreover, a body of insulating material with a thickness of 800 $\mu$m results in a semiconductor device with an impractical thickness, as no use can be made of equipment which is customarily employed for enveloping semiconductor devices provided on conventional semiconductor wafers. In addition, the parasitic capacitance can be reduced by employing a body with a dielectric constant $\in_r$ which is lower than that of glass. However, this is not always a practical solution, as a body of such a material, for example quartz, is in general more expensive.

It is an object of the invention to further reduce the power consumption of a semiconductor device of the kind mentioned in the opening paragraph without the necessity of employing a body of insulating material of impractical thickness or a body of an impractical material.

According to the invention, this object is achieved in that an insulating layer having a dielectric constant $\in_r$ below 3 is disposed between the superficial patterned metal layer of the interconnect structure and the body of insulating material, and an insulating barrier layer is disposed between the semiconductor element and the insulating layer having a dielectric constant $\in_r$ below 3, so as to counteract that contaminants from the insulating layer having a dielectric constant $\in_r$ below 3 cannot reach the semiconductor element.

The invention is based inter alia on the insight, that the size of the parasitic capacitances is predominantly determined by the dielectric constant $\in_r$ of the dielectric which is closest to the conductor tracks of the interconnect structure of the semiconductor device, and that the use of a relatively thin layer of a material having a relatively low dielectric constant $\in_r$ between the interconnect structure of the semiconductor device and the body of insulating material already results in a relatively large reduction of the parasitic capacitances. By using an insulating layer having a dielectric constant $\in_r$ of about 2.5 and a thickness of approximately 25 $\mu$m, the parasitic capacitance, as in the above-mentioned example, between a 1 $\mu$m wide conductor track of the interconnect structure of the semiconductor device and the interconnect structure present on the printed circuit board or inside the envelope is reduced by 40% when use is made of a 400 $\mu$m thick body of glass with a dielectric constant $\in_r$ of 6.5. The power consumption of the semiconductor device is reduced by practically the same percentage. Such a low dielectric-constant layer often comprises organic material, which organic material generally represents a source of contaminants such as alkali ions. These contaminants may reach the semiconductor element and adversely influence the performance of the semiconductor element. Hence, in order to counteract a reduction in the stability of the semiconductor element owing to the presence of the insulating layer having a dielectric constant $\in_r$ below 3, an insulating barrier layer is disposed between the semiconductor element and the insulating layer having a dielectric constant $\in_r$ below 3.

Although the insulating barrier layer may be disposed between the insulating layer having a dielectric constant $\in_r$ below 3 and the superficial patterned metal layer of the interconnect structure, it is advantageously disposed between the superficial patterned metal layer and the semiconductor element. In this way, one layer is saved during the manufacture of the semiconductor device.

It is advantageous that the insulating barrier layer is a plasma-deposited layer. It is evident to a person skilled in the art that, although other deposition techniques such as, for example, sputter deposition may give satisfactory results, plasma-assisted deposition techniques such as plasma-enhanced chemical vapor deposition (PECVD) and electron cyclotron resonance (ECR) plasma chemical vapor deposition (CVD) are pre-eminently suited for the deposition of the insulating barrier layer. Plasma-assisted deposition techniques enable the provision of layers at very low temperatures, that is to say at temperatures between about 100° C. and 400° C. in the case of PECVD and at temperatures between room temperature and about 150° C. in the case of ECR plasma CVD, by reacting the gases in a glow discharge, which supplies much of the energy needed for the reaction. As a result, less stringent demands need to be imposed on the thermal stability of the materials applied in preceding process steps.

Although other suitable plasma-deposited materials such as, for example, silicon oxynitride may be used, the insulating barrier layer advantageously comprises plasma-deposited silicon nitride, which is the most commonly used material for insulating barriers in IC technology.

The insulating layer having a dielectric constant $\in_r$ below 3 is advantageously disposed in direct contact with the superficial patterned metal layer, thereby occupying spaces present between the conductor tracks of the superficial patterned metal layer. In the known, described semiconductor device, the interconnect structure, which includes a superficial patterned metal layer comprising conductor tracks, is covered by an insulating layer of silicon oxide or silicon nitride in a thickness of preferably 2 $\mu$m. As a result of the relatively large dielectric constants $\in_r$ of silicon nitride (6–9) and silicon oxide (4), the parasitic capacitances acting between the conductor tracks of the patterned metal layer are relatively large. These parasitic capacitances can be reduced substantially by making the insulating layer having a dielectric constant $\in_r$ below 3 also occupying the spaces between the conductor tracks of the patterned metal layer.

The semiconductor element and the interconnect structure are advantageously fastened to the surface of the body of insulating material by means of a layer of an adhesive, as such layer has a positive effect on the extent of planarization obtainable.

For the insulating layer having a dielectric constant $\in_r$ below 3 use may be advantageously made of a layer of parylene or benzocyclobutene. Parylene and benzocyclobutene are materials with a relatively low dielectric constant $\in_r$ of about 2.5 and, hence, significantly help in reducing the parasitic capacitances between the interconnect structure of the semiconductor device and the interconnect structure present on a printed circuit board or inside an envelope.

In order to simplify the manufacture of the semiconductor device, it is advantageous that the insulating layer having a dielectric constant $\in_r$ below 3 is a layer of benzocyclobutene, which layer of benzocyclobutene also provides for the layer of the adhesive.

The insulating layer of parylene or benzocyclobutene advantageously has a thickness in the range between 25 and 75 $\mu$m, as this results in a reduction of the parasitic capacitances between the interconnect structure of the semiconductor device and the interconnect structure present on the printed circuit board or inside the envelope by more than 40%, while the thickness of the semiconductor device does not reach impractical values.

Although the body of insulating material may be a body of, for example, a soft ferrite or quartz, the body of insulating material advantageously is a body of glass, as glass is a relatively cheap material.

These and other aspects of the invention will be apparent from and elucidated with reference to the embodiments described hereinafter and shown in the drawing. In the drawing.

Figure 1:
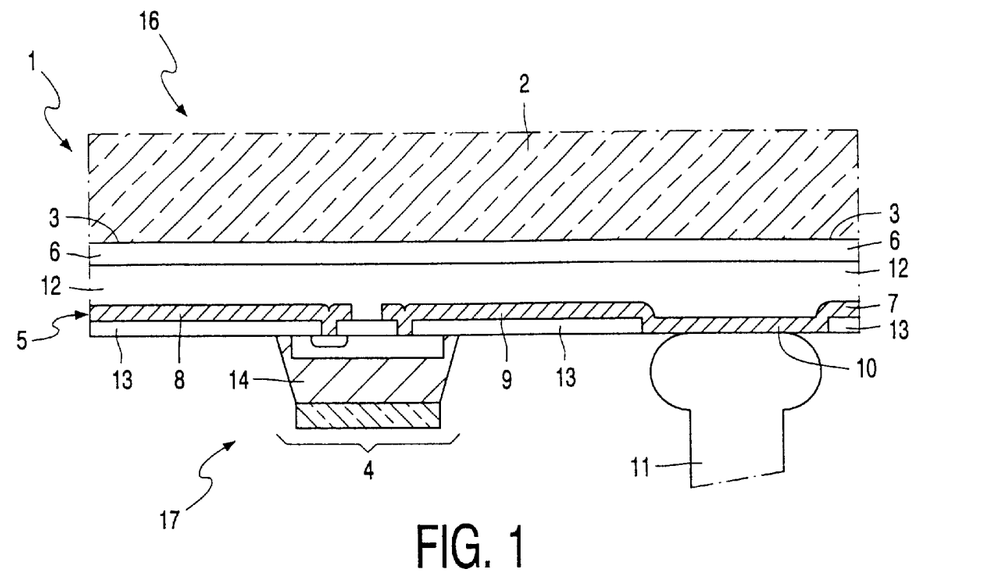
FIG. 1 shows in a diagrammatic cross-sectional view a first embodiment of the semiconductor device in accordance with the invention.
Figure 2:
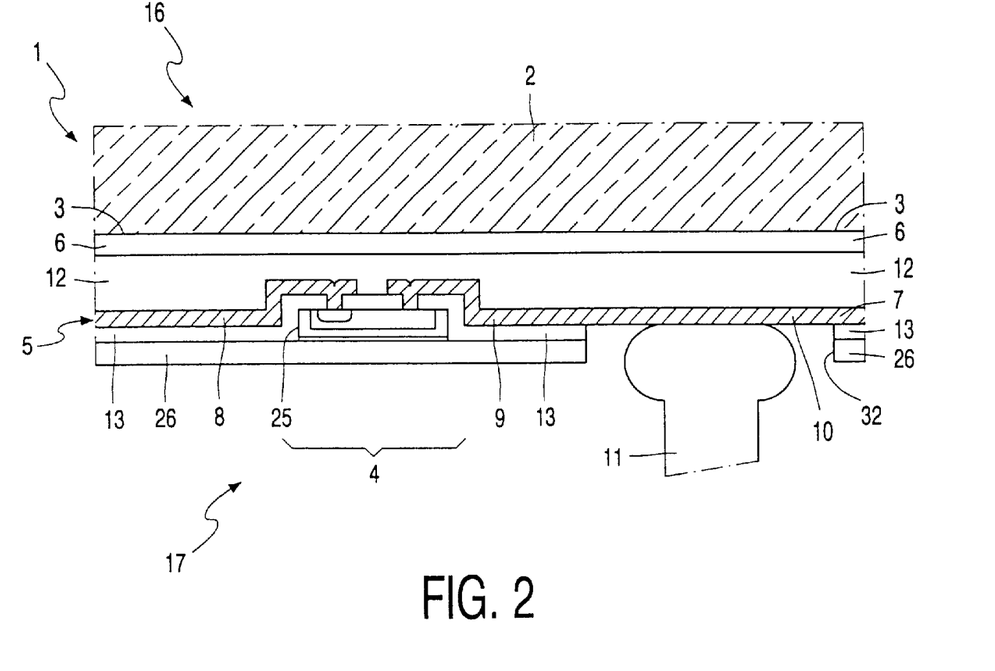
FIG. 2 shows in a diagrammatic cross-sectional view a second embodiment of the semiconductor device in accordance with the invention.

FIGS. 1 and 2 show in diagrammatic cross-sectional views two different embodiments of a semiconductor device 1, which semiconductor device 1 comprises a body 2 of insulating material having a surface 3 to which a semiconductor element 4 and an interconnect structure 5 are fastened by means of a layer 6 of an adhesive, which interconnect structure 5 is disposed between the semiconductor element 4 and the body 2 of insulating material and has a patterned metal layer 7 facing the body 2 of insulating material, which patterned metal layer 7 comprises conductor tracks 8 and 9. A contact portion 10, also referred to as bonding pad, is provided on the conductor track 9, which contact portion 10 enables electrical contact of the semiconductor device 1 to the external world, for example by means of a wire 11 which is secured to the contact portion 10 by means of a customary wire-bonding technique. Although the body 2 of insulating material may be a body of, for example, a soft ferrite or quartz, the body 2 of insulating material advantageously is a body of glass.

The semiconductor element 4 is a bipolar transistor in the present example, but may be, for example, a field-effect transistor or a diode. Alternatively, the semiconductor element 4 may be an integrated circuit comprising a large number of transistors. In the present example, the interconnect structure 5 comprises conductor tracks 8 and 9 for the electrical connection of the semiconductor element 4 to other semiconductor elements and to enable electrical contact of the semiconductor device 1 to the external world. It should be noted that the interconnect structures 5 may also comprise passive elements such as inductors, capacitors and resistors.

An insulating layer 12 having a dielectric constant $\in_r$ below 3 is disposed between the patterned metal layer 7 of the interconnect structure 5 and the layer 6 of the adhesive. By virtue of this measure, parasitic capacitances between the interconnect structure 5 of the semiconductor device 1 and the interconnect structure (not shown) present on a printed circuit board or inside an envelope can be reduced substantially. The use of an insulating layer 12 having a dielectric constant $\in_r$ of about 2.5 and a thickness of approximately 25 μm enables, for example, the parasitic capacitance between a 1 μm wide conductor track 8 of the interconnect structure 5 of the semiconductor device 1 and the interconnect structure present on the printed circuit board or inside the envelope to be reduced by 40% when use is made of a 400 μm thick body 2 of glass. Alternatively, the use of an approximately 50 μm thick insulating layer 12 with a dielectric constant $\in_r$ of about 2.5 results in a reduction of the parasitic capacitance by 45%. It is to be noted that the power consumption of the semiconductor device 1 is reduced by similar percentages. Although the insulating layer 12 having a dielectric constant $\in_r$ below 3 may be disposed between a further insulating layer (not shown) covering the patterned metal layer 7 of the interconnect structure 5 and the layer 6 of the adhesive, it is advantageously disposed in direct contact with the patterned metal layer 7, thereby occupying spaces present between the conductor tracks 8 and 9 of the patterned metal layer 7.

Furthermore, an insulating barrier layer 13 is disposed between the semiconductor element 4 and the insulating layer 12 having a dielectric constant $\in_r$ below 3, so as to preclude that contaminants from the insulating layer 12 having a dielectric constant $\in_r$ below 3 can reach the semiconductor element 4. Although the insulating barrier layer 13 may be disposed between the insulating layer 12 having a dielectric constant $\in_r$ below 3 and the patterned metal layer 7 of the interconnect structure 5, it is advantageously disposed between the patterned metal layer 7 and the semiconductor element 4.

Figure 3:
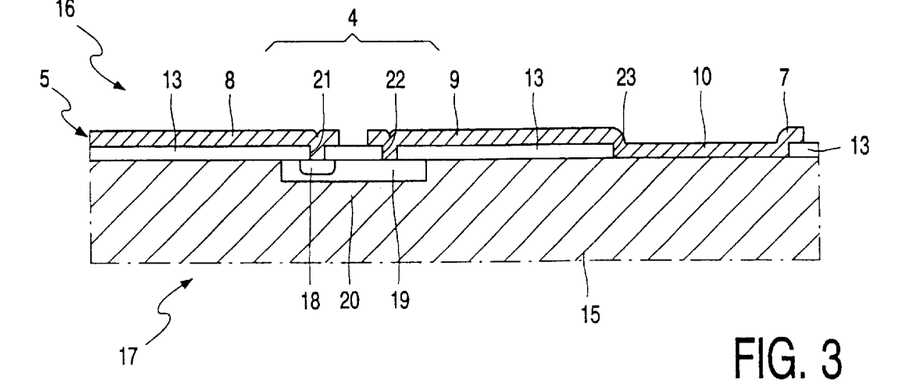
FIGS. 3 and 4 show in diagrammatic cross-sectional views successive stages in the manufacture of the semiconductor device as shown in FIG. 1, FIGS. 5 to 7 show in diagrammatic cross-sectional views successive stages in the manufacture of the semiconductor device as shown in FIG. 2.
Figure 4:
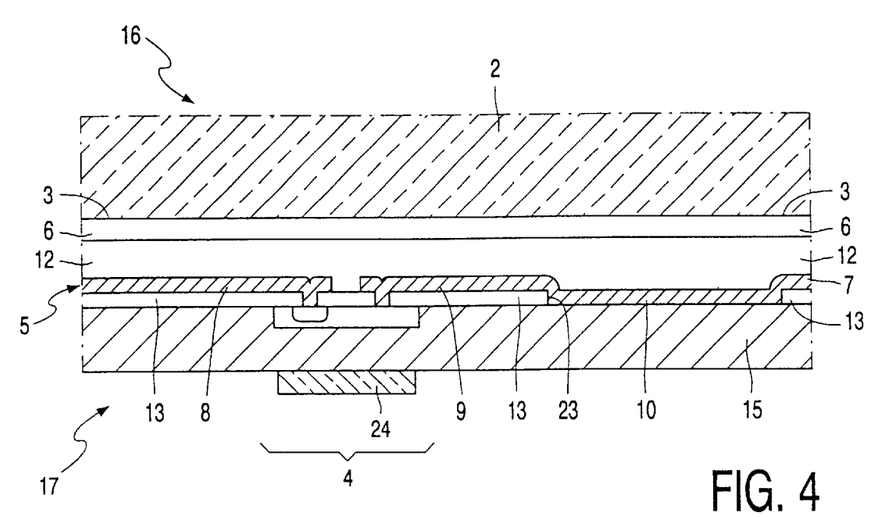

In the manufacture of the semiconductor device 1 as depicted in FIGS. 1 and 2, process steps, yet to be described, preceding the fastening of the semiconductor element 4 and the interconnect structure 5 by means of the layer 6 of the adhesive are carried out in a standard clean-room environment, whereas the fastening operation itself and process steps following the fastening operation are preferably carried out outside such an environment in a less clean space equipped for final mounting. A standard clean-room, in general, is equipped with very expensive deposition and photo-lithographic equipment, which is not required in the space for final mounting in the manufacture of the semiconductor device in accordance with the invention. FIGS. 3 and 4 show in diagrammatic cross-sectional views successive stages in the manufacture of the semiconductor device 1 as shown in FIG. 1, which semiconductor device has a body 2 of insulating material, which body 2 is provided at a surface 3 with a semiconductor element 4 and an interconnect structure 5, which semiconductor element 4 is formed in a so-called mesa 14 of a semiconductor material.

The manufacture starts (FIG. 3) with a body 15 of a semiconductor material, in the present example a silicon body of n-type conductivity. The body 15 of the semiconductor material is provided at a first side 16 with the semiconductor element 4, in the present example a bipolar transistor with an n-type emitter zone 18, a p-type base zone 19, and an n-type collector zone 20, which collector zone 20 is provided by a portion of the body 15 of the semiconductor material situated below the base zone 19.

In a next step, the insulating barrier layer 13 is provided in a thickness between, for example, about 0.5 and 1 μm at the first side 16 of the body 15 of the semiconductor material, in which insulating barrier layer 13 windows 21, 22 and 23 are etched. The insulating barrier layer 13, which protects the semiconductor element 4 against contamination from the insulating layer 12 having a dielectric constant $\in_r$ below 3, is advantageously applied as a plasma-deposited layer, that is to say a layer deposited by means of a plasma-assisted deposition techniques such as plasma enhanced chemical vapor deposition (PECVD) or electron cyclotron resonance (ECR) plasma chemical vapor deposition (CVD). Although silicon oxynitride may be used, the plasma-deposited insulating barrier layer 13 advantageously comprises silicon nitride. A layer of a conductive material is deposited on the insulating barrier layer 13 and in the windows 21, 22 and 23, which layer of conductive material is etched in a usual way to form the patterned metal layer 7 comprising the conductor tracks 8 and 9. In this respect, aluminum, tungsten, copper or molybdenum, or a combination of metals, may be used. Such a metal is advantageously applied on top of a layer acting as an adhesion layer and/or barrier layer. In this respect, titanium (Ti) may be applied as the adhesion layer and titanium nitride (TiN) or titanium tungsten (TiW) as the barrier layer. The conductor track 9 comprises the contact portion 10 for external electrical contact, which contact portion 10 is situated within the window 23 on the body 15 of the semiconductor material.

After the semiconductor element 4 and the interconnect structure 5 have been formed at the first side 16 of the body 15 of the semiconductor material, the insulating layer 12 having a dielectric constant $\in_r$ below 3 is applied (FIG. 4). The insulating layer 12 is advantageously applied as a layer of parylene or benzocyclobutene, both materials having a dielectric constant $\in_r$ of about 2.5, in a thickness between about 25 and 75 μm. Benzocyclobutene may be applied by means of spin coating, whereas parylene may be applied by means of vapor deposition polymerization. Subsequently, the body 15 of the semiconductor material is fastened with the first side 16 to the body 2 of insulating material by means of the layer 6 of the adhesive, which may be, for example, a layer of an epoxy or acrylate glue in a thickness of, for example, about 15 μm.

Then, the body 15 of the semiconductor material is subjected at the opposed, second side 17 to a material removing treatment until the semiconductor material is removed, except at the area of the semiconductor element 4, as shown in FIG. 1. This can be done by providing the body 15 of the semiconductor material at the second side 17 with an etching mask 24 at the area of the semiconductor element 4, which etching mask 24 may be formed by depositing and etching a layer of, for instance, silicon nitride, and subsequently removing the exposed semiconductor material, in the present example silicon, by means of etching with a KOH solution until the insulating barrier layer 13, in the present example composed of plasma-deposited silicon nitride, is exposed. Etching automatically stops at the insulating barrier layer 13. Thus, of the body 15 of the semiconductor material, only the mesa 14 of the semiconductor material formed at the area of the semiconductor element 4 remains, as shown in FIG. 1.

As etching proceeds relatively slowly, the removal of the semiconductor material of the body 15 may be advantageously accelerated by the maskless removal of the semiconductor material over part of its thickness before applying the etching mask 24, the result of which is actually shown in FIG. 4, and subsequently etching the exposed semiconductor material. This maskless removal can be advantageously carried out by means of chemical-mechanical polishing.

In order to protect the conductive material of the contact portion 10 situated in the window 23 during etching of the semiconductor material, a silicon nitride layer (not shown)

may be advantageously applied at the first side 16 of the body 15 of the semiconductor material before the patterned metal layer 7 comprising the conductor tracks 8 and 9 is formed. This silicon nitride layer obviously needs to be removed after the removal of the semiconductor material of the body 15, so as to expose the contact portion 10 of the conductor track 9, which exposed contact portion 10 is finally provided with the wire 11 by means of a customary wire-bonding technique in order to electrically connect the semiconductor device 1 with the external world.

Figure 5:
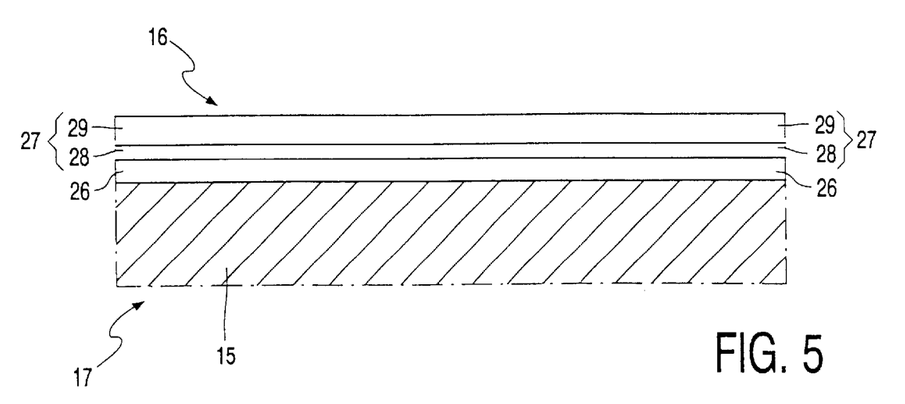
Figure 6:
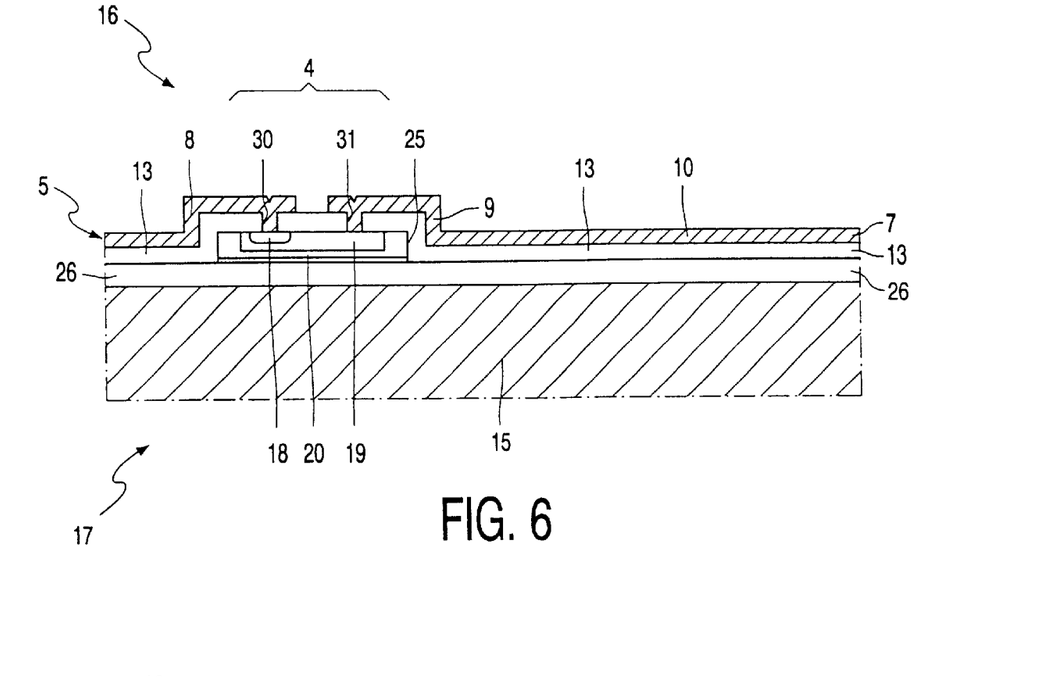
Figure 7:
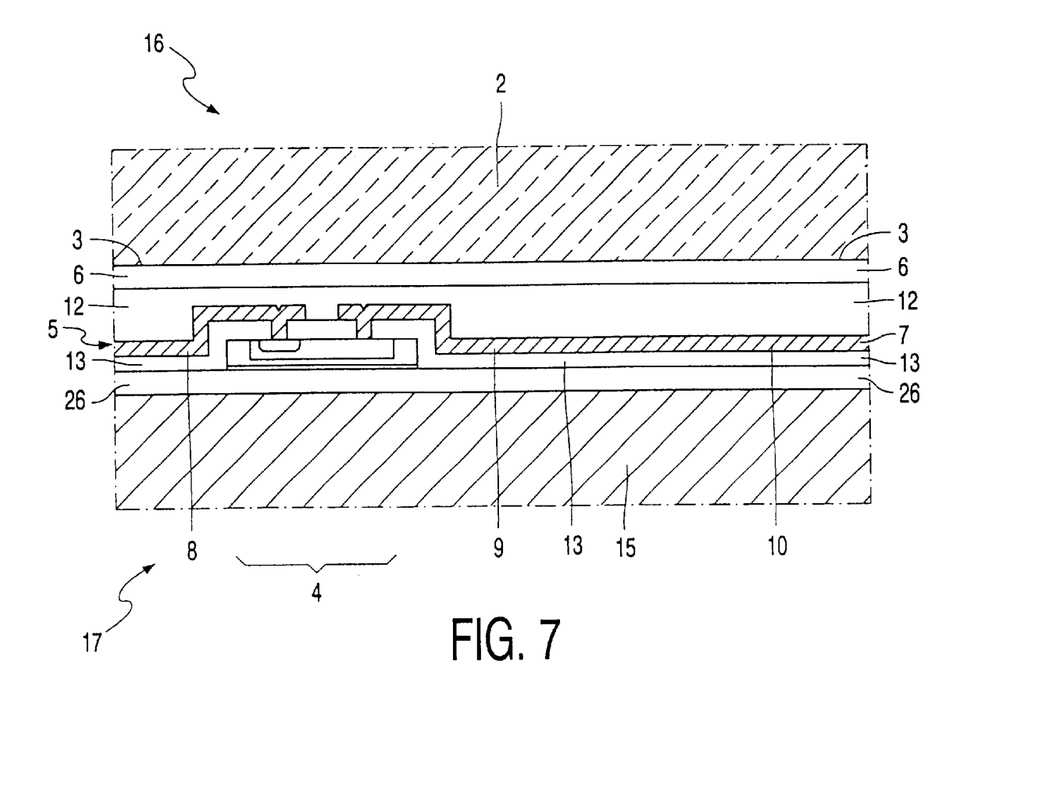

FIGS. 5 to 7 show in diagrammatic cross-sectional views successive stages in the manufacture of the semiconductor device 1 as shown in FIG. 2, which semiconductor device has a body 2 of insulating material, which body 2 is provided at a surface 3 with a semiconductor element 4 and an interconnect structure 5, which semiconductor element 4 is formed in an island 25 of a semiconductor material.

The manufacture starts (FIG. 5) with a body 15 of a semiconductor material, in the present example a silicon body, which body 15 is provided at a first side 16 with an insulating layer 26, in the present example a layer composed of silicon oxide with a thickness of about 0.4 $\mu$m, which insulating layer 26 is covered with a layer 27 of a semiconductor material, in the present example a silicon layer of n-type conductivity with a thickness of about 2 $\mu$m. In the present example, the layer 27 of the semiconductor material is applied as a double-layer comprising a comparatively lightly-doped second sub-layer 29 of silicon with a thickness of about 1 $\mu$m on top of a comparatively strongly-doped first sub-layer 28 of silicon with a thickness of about 1 $\mu$m as well. Published patent application WO 96/16443 describes ways of manufacturing a composite structure like that described above.

In a next step, the body 15 of the semiconductor material is provided at the first side 16 with the semiconductor element 4 and the interconnect structure 5. It is advantageous to form, in the layer 27 of the semiconductor material, the island 25 provided with the semiconductor element 4 (FIG. 6). The island 25 of the semiconductor material can be formed, for example, by converting the layer 27 of the semiconductor material next to the island 25 into, for example, silicon oxide. In the present example, the island 25 of the semiconductor material is formed by removing the layer 27 of the semiconductor material next to the island 25 by means of etching. It is to be noted, that the provision of the semiconductor element 4 can take place either before or after the formation of the island 25 of the semiconductor material. In this way, the island 25 of the semiconductor material is formed provided with the semiconductor element 4, in the present example a bipolar transistor with an n-type emitter zone 18, a p-type base zone 19, and an n-type collector zone 20, which collector zone 20 is provided by a portion of the layer 27 of the semiconductor material situated below the base zone 19.

In a next step, the insulating barrier layer 13 is provided in a thickness between, for example, about 0.5 and 1 $\mu$m at the first side 16 of the body 15 of the semiconductor material, in which insulating barrier layer 13 windows 30 and 31 are etched for contacting, respectively, the emitter zone 18 and the base zone 19 of the bipolar transistor. The insulating barrier layer 13, which protects the semiconductor element 4 against contamination from the insulating layer 12 having a dielectric constant $\in_r$ below 3, is advantageously applied as a plasma-deposited layer, that is to say a layer deposited by means of a plasma-assisted deposition technique such as plasma enhanced chemical vapor deposition (PECVD) or electron cyclotron resonance (ECR) plasma chemical vapor deposition (CVD). Although silicon oxynitride may be used, the plasma-deposited insulating barrier layer 13 advantageously comprises silicon nitride. A layer of conductive material is deposited on the insulating barrier layer 13 and in the windows 30 and 31, which layer of conductive material is etched in a usual way to form the patterned metal layer 7 comprising the conductor tracks 8 and 9. In this respect, aluminum, tungsten, copper or molybdenum, or a combination of metals may be used. Such a metal is advantageously applied on top of a layer acting as an adhesion layer and/or barrier layer. In this respect titanium (Ti) may be applied as the adhesion layer and titanium nitride (TiN) or titanium tungsten (TiW) as the barrier layer. The conductor track 9 comprises the contact portion 10 for external electrical contact, which contact portion 10 is situated on the insulating barrier layer 13.

After the semiconductor element 4 and the interconnect structure 5 have been formed at the first side 16 of the body 15 of the semiconductor material, the insulating layer 12 having a dielectric constant $\in_r$ below 3 is applied (FIG. 7). The insulating layer 12 is advantageously applied as a layer of parylene or benzocyclobutene, both materials having a dielectric constant $\in_r$ of about 2.5, in a thickness between about 25 and 75 $\mu$m. Benzocyclobutene may be applied by means of spin coating, whereas parylene may be applied by means of vapor deposition polymerization. Subsequently, the body 15 of the semiconductor material is fastened with the first side 16 to the body 2 of insulating material by means of the layer 6 of the adhesive, which may be, for example, a layer of an epoxy or acrylate glue in a thickness of, for example, about 15 $\mu$m.

Then, the body 15 of the semiconductor material is subjected at the opposed, second side 17 to a material removing treatment until the semiconductor material, in the present example silicon, is removed down to the insulating layer 26, which in the present example, is composed of silicon oxide. To this end, the body 15 of the semiconductor material is subjected at the second side 17 to a grinding treatment, which is continued until the insulating layer 26 has been approached up to a few $\mu$m, after which an etching solution of KOH is applied to actually expose the insulating layer 26, which acts as a stopping layer.

Finally, a window 32 is etched in a customary way through the insulating layer 26 which, in the present example, is composed of silicon oxide, and through the insulating barrier layer 13 which, in the present example, is composed of silicon nitride. Hence, the contact portion 10 of the conductor track 9 is exposed, which exposed contact portion 10 is finally provided with the wire 11 by means of a customary wire-bonding technique in order to electrically connect the semiconductor device 1 with the external world.

Figure 8:
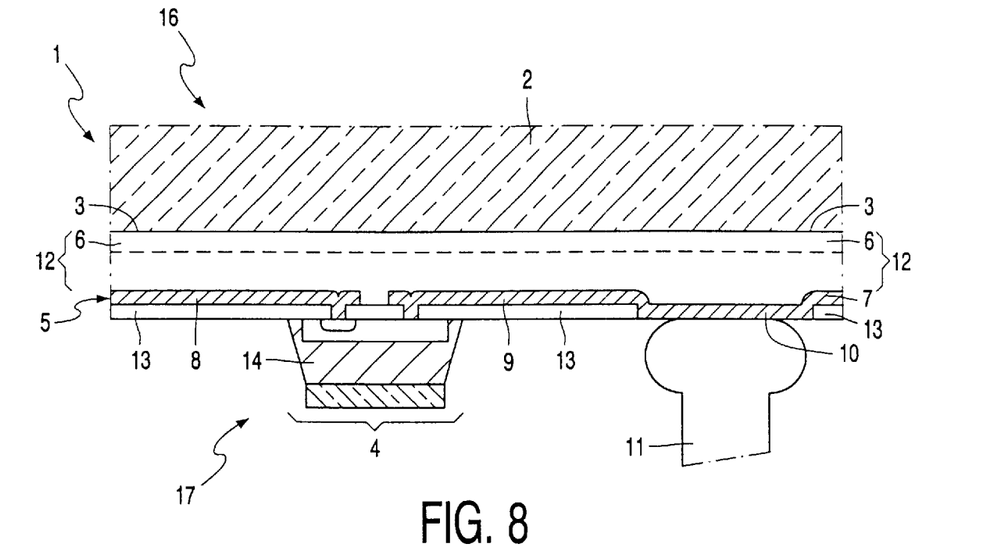
FIG. 8 shows in a diagrammatic cross-sectional view a third embodiment of the semiconductor device in accordance with the invention.
Figure 9:
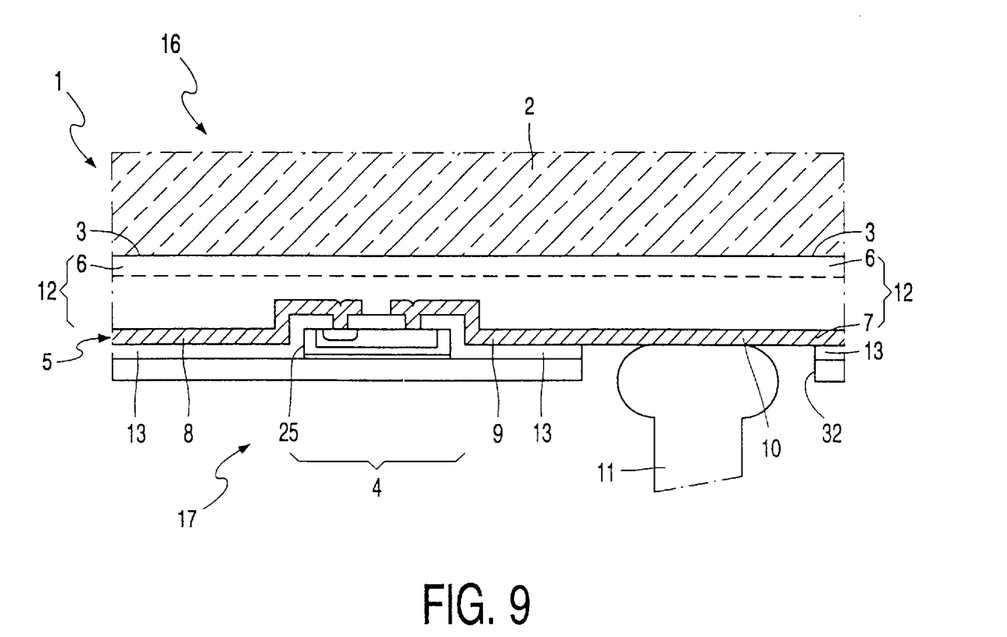
FIG. 9 shows in a diagrammatic cross-sectional view a fourth embodiment of the semiconductor device in accordance with the invention.

FIGS. 8 and 9 show in diagrammatic cross-sectional views two other embodiments of the semiconductor device in accordance with the invention, in which corresponding parts are denoted by the same reference numerals as in the examples associated with FIGS. 1 and 2. The insulating layer 12 having a dielectric constant $\in_r$ below 3, which insulating layer 12 is applied here as a layer of benzocyclobutene, now also provides for the layer 6 of the adhesive. The thickness of the insulating layer 12 of benzocyclobutene is between about 25 and 75 $\mu$m. The insulating barrier layer 13, which protects the semiconductor element 4 against contamination from the insulating layer 12 having a dielectric constant $\in_r$ below 3, and which is composed of plasma-deposited silicon nitride in the present example, is disposed between the patterned metal layer 7 and the semiconductor element 4.

Figure 10:
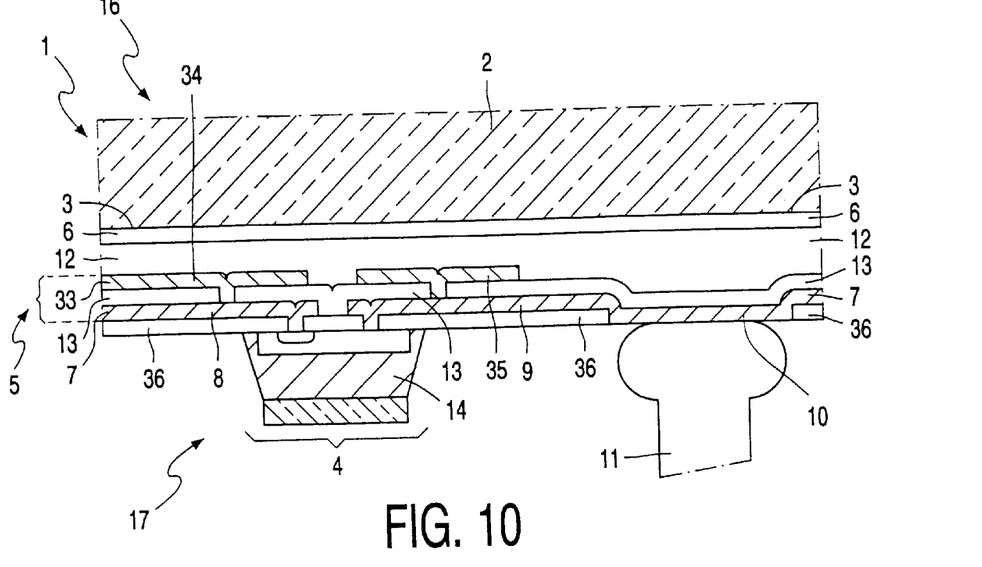
FIG. 10 shows in a diagrammatic cross-sectional view a fifth embodiment of the semiconductor device in accordance with the invention.
Figure 11:
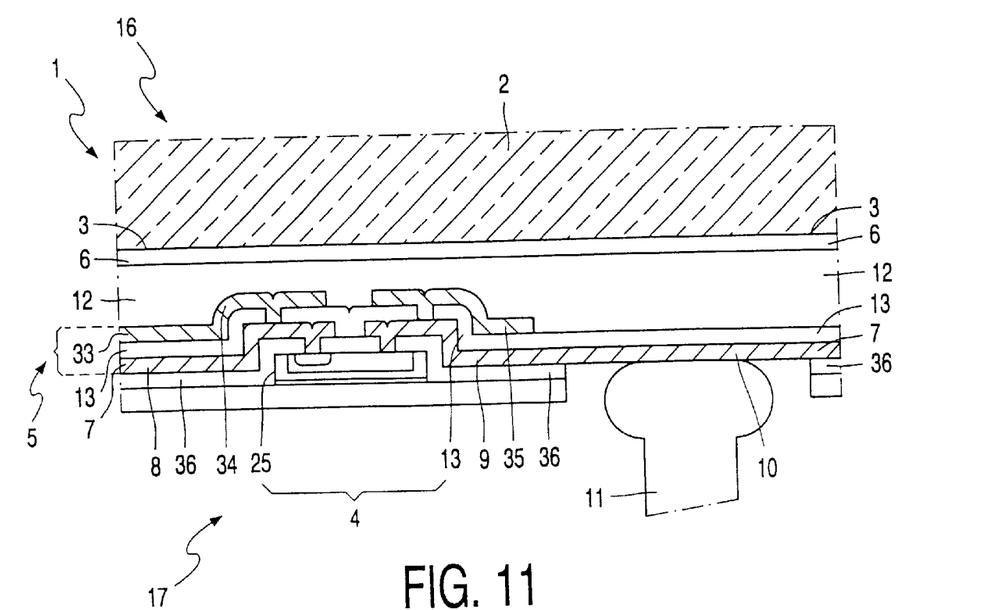
FIG. 11 shows in a diagrammatic cross-sectional view a sixth embodiment of the semiconductor device in accordance with the invention.

FIGS. 10 and 11 show in diagrammatic cross-sectional views two further embodiments of the semiconductor device in accordance with the invention, in which corresponding parts are again denoted by the same reference numerals as in the examples associated with FIGS. 1 and 2. Besides the patterned metal layer 7 comprising the conductor tracks 8 and 9, the interconnect structure 5 now also comprises a superficial patterned metal layer 33 at a side of the patterned metal layer 7 facing the body 2 of insulating material, which superficial patterned metal layer 33 comprises conductor tracks 34 and 35. Although the body 2 of insulating material may be a body of, for example, a soft ferrite or quartz, the body 2 of insulating material advantageously is a body of glass. The insulating layer 12 having a dielectric constant $\in_r$ below 3 is disposed in direct contact with the superficial patterned metal layer 33, thereby occupying spaces present between the conductor tracks 34 and 35 of the superficial patterned metal layer 33. The insulating layer 12 is advantageously applied as a layer of parylene or benzocyclobutene, both materials having a dielectric constant $\in_r$ of about 2.5, in a thickness between about 25 and 75 µm. The insulating barrier layer 13 is now disposed between the patterned metal layer 7 and the superficial patterned metal layer 33 of the interconnect structure 5, and has a thickness between, for example, about 0.5 and 1 µm. The insulating barrier layer 13, which protects the semiconductor element 4 against contamination from the insulating layer 12 having a dielectric constant $\in_r$ below 3, is advantageously applied as a plasma-deposited layer, that is to say a layer deposited by means of a plasma-assisted deposition technique such as plasma enhanced chemical vapor deposition (PECVD) or electron cyclotron resonance (ECR) plasma chemical vapor deposition (CVD). Although silicon oxynitride may be used, the plasma-deposited insulating barrier layer 13 advantageously comprises silicon nitride. The patterned metal layer 7 and the mesa 14 of the semiconductor material (FIG. 10) or the island 25 of the semiconductor material (FIG. 11) are insulated from one another by a further insulating layer 36 composed of, for example, silicon oxide.

Figure 12:
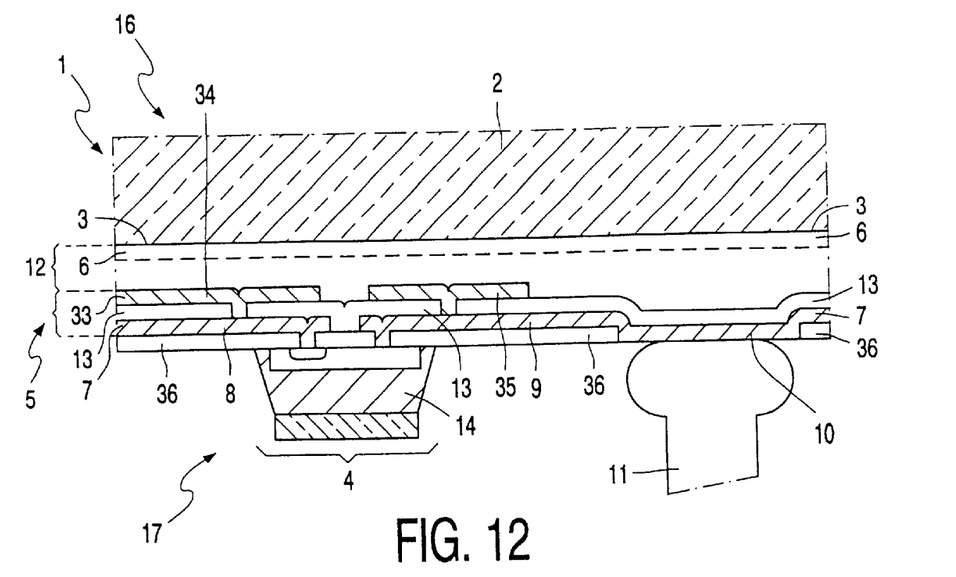
FIG. 12 shows in a diagrammatic cross-sectional view a seventh embodiment of the semiconductor device in accordance with the invention.
Figure 13:
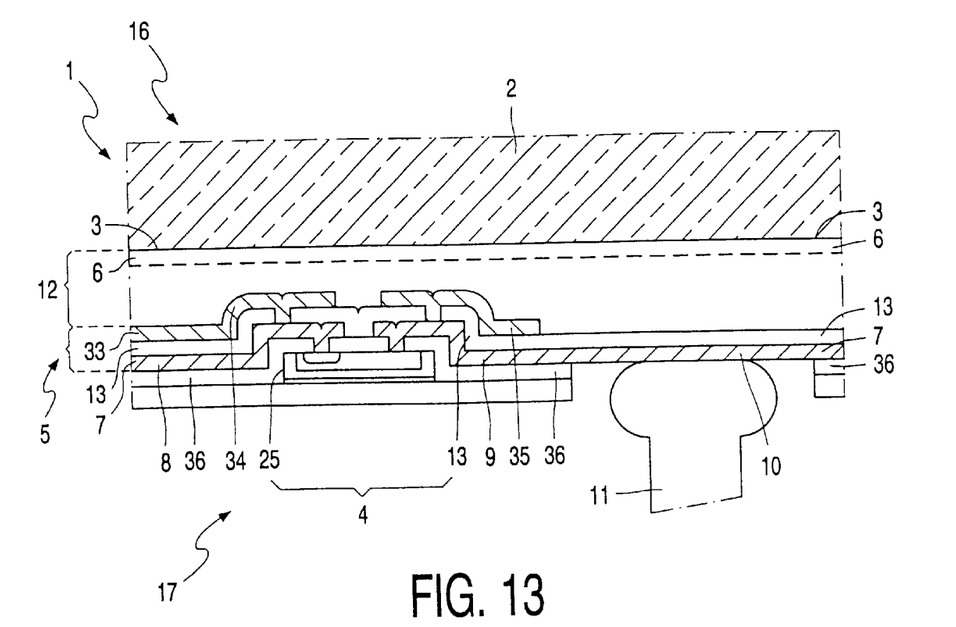
FIG. 13 shows in a diagrammatic cross-sectional view an eighth embodiment of the semiconductor device in accordance with the invention.

FIGS. 12 and 13 show in diagrammatic cross-sectional views two further embodiments of the semiconductor device in accordance with the invention, in which corresponding parts are denoted by the same reference numerals as in the examples associated with FIGS. 10 and 11. The insulating layer 12 having a dielectric constant $\in_r$ below 3, which insulating layer 12 is applied here as a layer of benzocyclobutene, now also provides for the layer 6 of the adhesive. The thickness of the insulating layer 12 of benzocyclobutene is between about 25 and 75 µm. The insulating barrier layer 13, which protects the semiconductor element 4 against contamination from the insulating layer 12 having a dielectric constant $\in_r$ below 3, and which is composed of plasma-deposited silicon nitride in the present example, is disposed between the patterned metal layer 7 and the superficial patterned metal layer 33 of the interconnect structure 5.

It will be apparent that the invention is not limited to the embodiments described above, but that many variations are possible to those skilled in the art within the scope of the invention. The interconnect structure of the semiconductor device may of course comprise more than two patterned metal layers. Moreover, considering the relatively high dielectric constant $\in_r$ of silicon nitride (6–9), it may be advantageous to apply the insulating barrier layer as a sub-layer of an insulating layer, which insulating layer consists of at least two sub-layers, so as to reduce parasitic capacitances acting e.g. between the conductor tracks of the interconnect structure or between the semiconductor element and the interconnect structure. In this respect, a plasma-deposited layer of silicon nitride may be applied in a thickness of, for example, about 100 nm as the insulating barrier layer on top of or below a layer of a lower dielectric constant material such as, for example, a layer of silicon oxide deposited by means of, for example, low-pressure CVD in a thickness of, for example, 400 nm. Alternatively, the plasma-deposited layer of silicon nitride may be applied in a thickness of, for example, about 100 nm as the insulating barrier layer on top of, but preferably below, a low-dielectric constant material composed of organic material and deposited by means of, for example, spin coating in a thickness of, for example, 400 nm. Silicon oxynitride, which has a dielectric constant somewhere in between the dielectric constants of silicon oxide (4) and silicon nitride (6–9), may be applied instead of silicon nitride. It will be obvious to a person skilled in the art that numerous combinations are possible.

What is claimed is:

1. A semiconductor device comprising a body of insulating material, which body of insulating material has a surface to which a semiconductor element and an interconnect structure are fastened, which interconnect structure is disposed between the semiconductor element and the body of insulating material and has a superficial patterned metal layer facing the body of insulating material, which superficial patterned metal layer comprises conductor tracks, characterized in that an insulating layer having a dielectric constant $\in_r$ lower than a dielectric constant $\in_r$ of the body of insulating material and is disposed between the superficial patterned metal layer of the interconnect structure and the body of insulating material, and an insulating barrier layer is disposed between the semiconductor element and the insulating layer having a dielectric constant $\in_r$ below 3, so as to counteract that contaminants from the insulating layer having a dielectric constant $\in_r$ below 3 can reach the semiconductor element.

2. A semiconductor device as claimed in claim 1, characterized in that the insulating barrier layer is disposed between the superficial patterned metal layer and the semiconductor element.

3. A semiconductor device as claimed in claim 1, characterized in that the interconnect structure comprises at least two patterned metal layers insulated from one another by a dielectric layer, which dielectric layer is disposed as the insulating barrier layer.

4. A semiconductor device as claimed in claim 1, characterized in that the insulating barrier layer is a plasma-deposited layer.

5. A semiconductor device as claimed in claim 4, characterized in that the plasma-deposited layer comprises silicon nitride.

6. A semiconductor element as claimed in claim 1, characterized in that the insulating layer having a dielectric constant $\in_r$ below 3 is disposed in direct contact with the superficial patterned metal layer of the interconnect structure, thereby occupying spaces present between the conductor tracks of the superficial patterned metal layer.

7. A semiconductor device as claimed in claim 1, characterized in that the semiconductor element and the interconnect structure are fastened to the surface of the body of insulating material by means of a layer of an adhesive.

8. A semiconductor device as claimed in claim 1, characterized in that the insulating layer having a dielectric constant $\in_r$ below 3 is a layer of parylene or benzocyclobutene.

9. A semiconductor device as claimed in claim 8, characterized in that the layer of benzocyclobutene provides for the layer of the adhesive.

10. A semiconductor device as claimed in claim 8, characterized in that the insulating layer of parylene or benzocyclobutene has a thickness in the range between 25 and 75 μm.

11. A semiconductor device as claimed in claim 1, characterized in that the body of insulating material is a body of glass.

12. The semiconductor device as described in claim 1, wherein the insulating layer has a dielectric constant below 3.

13. The semiconductor device as described in claim 1, further comprising passive elements connected to the interconnect structure.

14. A semiconductor device comprising a body of insulating material having a surface to which a semiconductor element and an interconnect structure are fastened, which interconnect structure is disposed between the semiconductor element and the body of insulating material and has a superficial patterned metal layer facing the body of insulating material, which superficial patterned metal layer comprises a first conductor track and a second conductor track, characterized in that an insulating layer having a dielectric constant $\in_r$ below 3 which is lower than a dielectric constant $\in_r$ of the body of in sulation material and is disposed between the superficial patterned metal layer of the interconnect structure and the body of insulating material, with passive elements connected to the interconnect structure and further having an insulating barrier layer is disposed between the semiconductor element and the patterned metal layer so as to prevent contaminants from the insulating layer can reach the semiconductor element.

15. A semiconductor device as claimed in claim 14, characterized in that the interconnect structure comprises at least two patterned metal layers insulated from one another by a dielectric barrier layer, which dielectric layer is disposed as the insulating barrier layer.

16. A semiconductor device as claimed in claim 14, characterized in that the semiconductor element and the interconnect structure are fastened to the surface of the body of insulating material by means of a layer of an adhesive.

17. A semiconductor device as claimed in claim 14, characterized in that the insulating layer having a dielectric constant $\in_r$ below 3 is a layer of parylene or benzocyclobutene.

18. A semiconductor device as claimed in claim 14, characterized in that the body of insulating material is formed of glass.

19. A semiconductor device as claimed in claim 14, characterized in that the body of insulating material has a thickness substantially equal to 400 μm and the insulating layer has a thickness substantially equal to 25 μm.

* * * * *